United States Patent [19]

Gagliano et al.

[11] Patent Number: 4,944,979
[45] Date of Patent: Jul. 31, 1990

[54] TAPE CONVEYERS FOR COMPONENTS

[75] Inventors: Francis P. Gagliano, Mountainside; Solomon L. Hechtlinger, Somerset, both of N.J.

[73] Assignee: AT&T Bell Laboratories, Murray Hill, N.J.

[21] Appl. No.: 423,826

[22] Filed: Oct. 19, 1989

[51] Int. Cl.$^5$ ............... B65D 85/30; B65D 75/22
[52] U.S. Cl. .................................. 428/43; 428/76; 206/330; 206/824
[58] Field of Search ............... 428/43, 76, 138; 206/330, 824

[56] References Cited

U.S. PATENT DOCUMENTS

| | | | |
|---|---|---|---|
| 4,327,482 | 5/1982 | Araki et al. | 29/740 |
| 4,438,559 | 3/1984 | Asai et al. | 29/740 |
| 4,440,355 | 4/1984 | Mori et al. | 242/55 |
| 4,633,370 | 12/1986 | Hamuro et al. | 206/330 |

OTHER PUBLICATIONS

EIA Standaard-481 Revision A, "Taping of Surface Mount Components for Automatic Placement" Feb., 1986.
Minutes of the Automated Component Handling Committee, Apr. 20, 1989, "EIA Standard Proposal" by Richard D. Schulte (Attachment A).

Primary Examiner—Alexander S. Thomas
Attorney, Agent, or Firm—Ruloff F. Kip

[57] ABSTRACT

An improvement is provided for a conveyer tape comprising an underlying flexible belt, a stock of parts disposed in a row along such belt, adhesive deposited on the belt in two bands flanking such row, and a cover tape extending in the length of the row over the parts to hold them on the belt, the tape being adhered on laterally opposite sides of the row to the belt by adhesive in such bands. The improvement involves providing two sets of perforations formed in the tape to demarcate therein two tear lines extending in the length of the tape and disposed on opposite lateral sides of the row of parts, laterally inwards of the adhesive bands. The perforations reduce the shearing strength of the tape along the tear lines to promote peeling at the front end of the tape away from the belt of a central strip of the tape lying between the tear lines and between border portions of the tape on either side of that strip and remaining adhered to the belt. The removal of the strip exposes parts at the front end of the belt to access to permit such exposed parts to be lifted away from the belt.

15 Claims, 7 Drawing Sheets

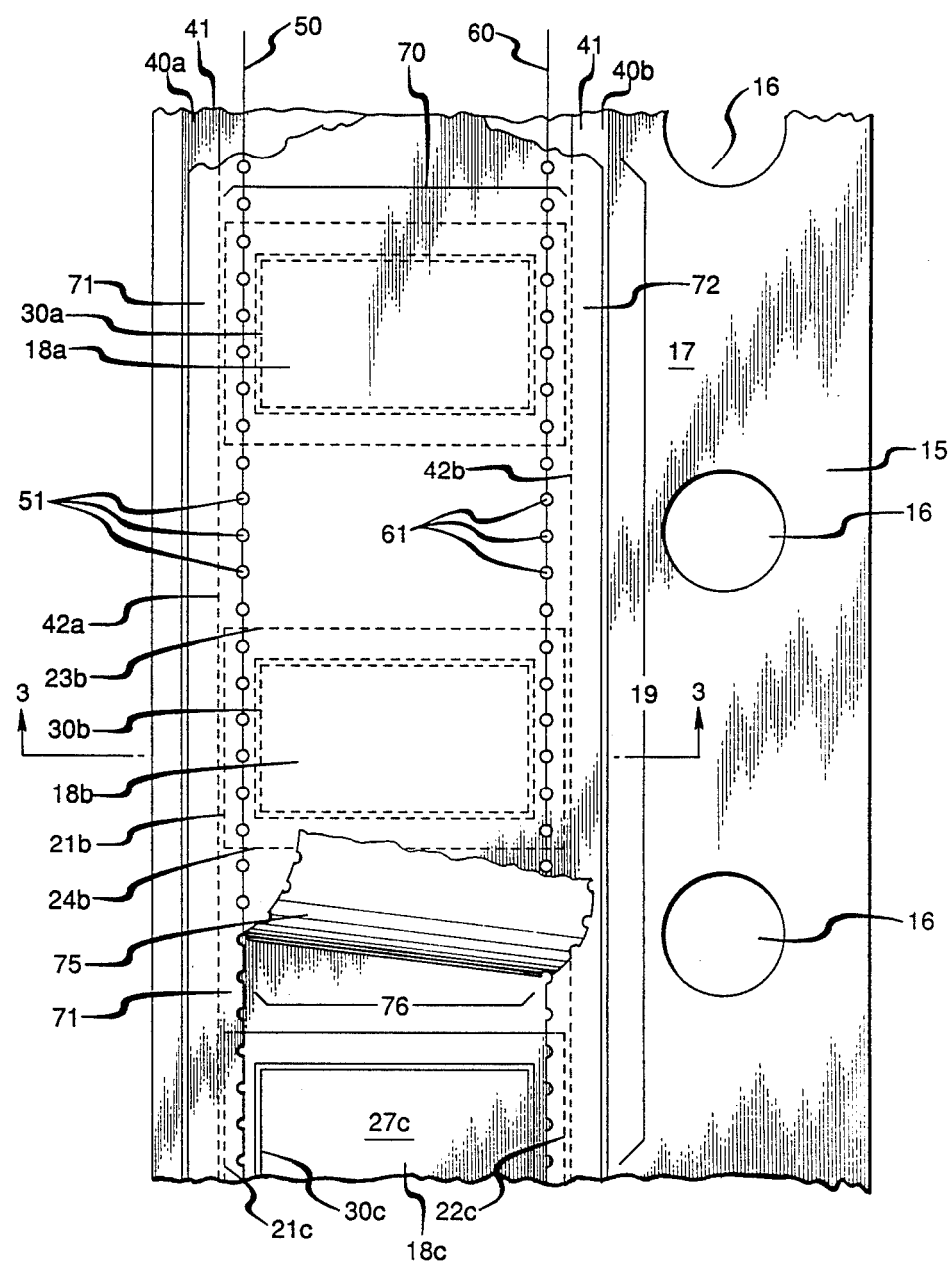

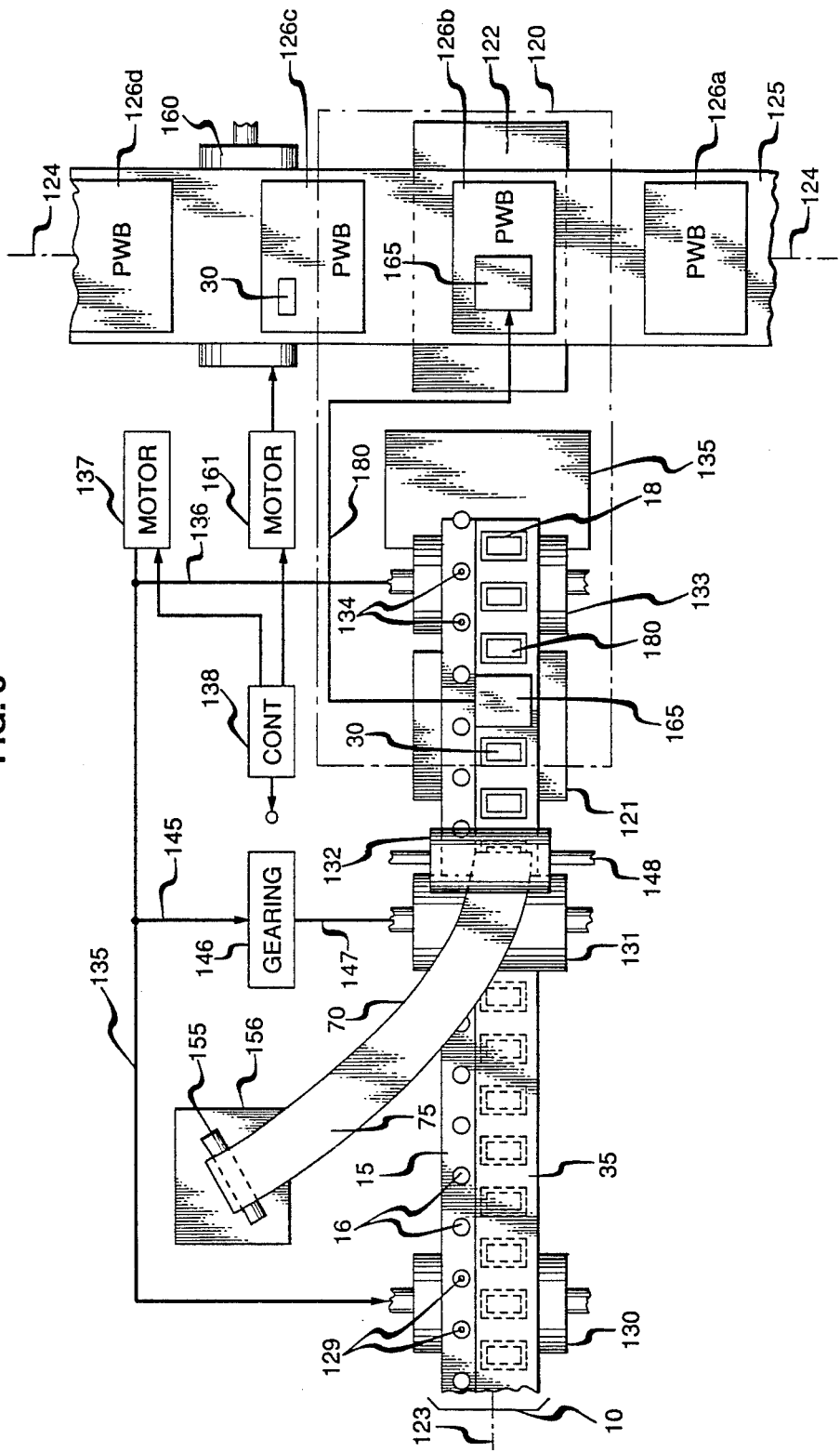

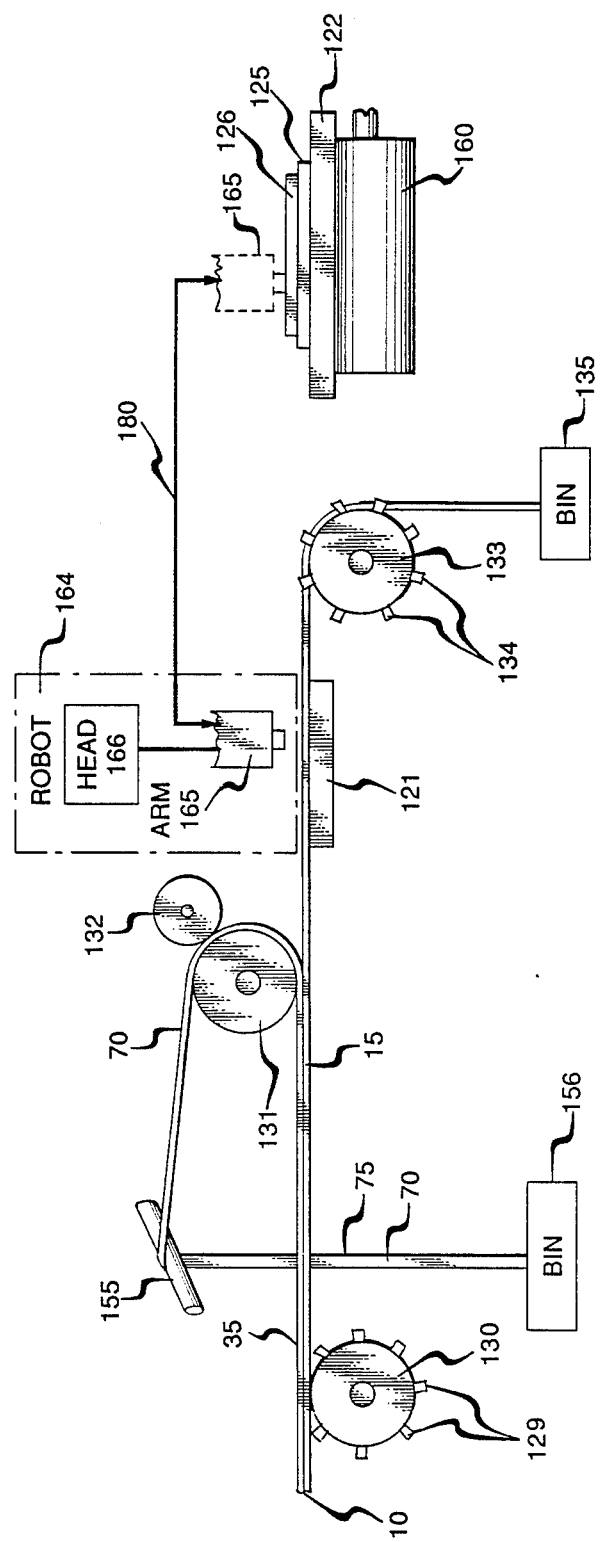

TAPE CONVEYERS FOR COMPONENTS

FIELD OF THE INVENTION

This invention generally concerns improvements in apparatus and methods relating to transport of components to a work station for incorporation into assemblages or for other processing. More particularly, this invention concerns improvements of such kind in which the transport of such components is effected by elongated flexible tape-like conveyer means which is referred to herein as a conveyer tape.

BACKGROUND OF THE INVENTION

Conveyer tapes are the subject of an EIA Standard, identified as *EIA-481 Revision A*, published in 1986 by the Electronic Industries Association, Engineering Department, 2001 Eye Street NW, Washington, D.C. 2006, and entitled "Taping of Surface Mount Components for Automatic Placement," such publication being incorporated herein by reference and made a part hereof. The conveyer tapes disclosed in such Standard ("Standard 481") each comprises an underlying elongated flexible carrier belt or tape with sprocket holes therein, a stock of component parts disposed in a row thereof extending in the length of such belt, and an overlying plastic cover tape extending in the length of such row over such parts and bonded by adhesive on either side of the row to the underlying carrier belt so as to hold such parts in place until it is time to remove them from the conveyer. When that time comes (as when, say, the conveyer tape approaches a work station), the leading end of the overlying cover tape is pulled away from the underlying carrier belt to expose forward ones of the transported parts to access from above so as to permit such exposed parts to be removed from the conveyer means by, say, a vacuum pick and place device.

EIA Standard 481 specifies that the plastic cover tape should have a thickness which, at the maximum, is 0.1 millimeter and that the "top cover tape shall have a peel strength of 0.4±0.3 newtons measured at 175°–180° with respect to the component carrier along the longitudinal axis of the carrier tape."

In the past, the cover tape has been pulled away from the carrier belt by rupturing the bond between the tape and the adhesive which secures the tape to the belt (in which case the adhesive remains on the belt) or, alternatively, by rupturing the bond between such adhesive and the belt (in which case the adhesive remains adhered to the tape). The strength, however, with which the adhesive is bonded to the tape and belt is a factor which can vary significantly in value even in the length of any one conveyer tape on either one or both of the adhered sides. One disadvantage arising from such variation is that the force needed to produce separation of the cover tape from the carrier may fluctuate substantially above and below the range of 0.4±0.3 newtons prescribed by EIA Standard 481. A more serious disadvantage is that it is not unusual for the strength of bonding of the adhesive to the tape and belt to be so high at places along the conveyer tape as to exceed the breaking strength of the cover tape. When, however, that circumstance occurs, the cover tape will break at those places with the unfortunate result ensuing that uncovered components at the forward end of the carrier will likely be spilled off of the conveyer by the shock of the breaking of the tape. Moreover, the component supplying operations must be stopped in order to rethread the end of the broken cover tape in the pulling mechanism, therefor, and that downtime is expensive. Alternately, when the bond strength is too low, spillage of components can occur to disrupt the supplying operation with resultant expensive downtime.

SUMMARY OF THE INVENTION

These and other disadvantages of the prior art practice are reduced or obviated according to the invention by improving the described conveyer means ( and methods for using it) as follows. The cover tape for such means is provided in its length with a pair of tear lines on opposite sides of the centerline of the row of parts carried by the underlying carrier belt. These tear lines divide the cover tape into a central strip and border portions disposed on opposite sides of such strip and adhered by adhesive to the underlying belt. The two tear lines are demarcated by discontinuities formed in the tape's structure to weaken and control its shearing strength along such lines so as, when it is necessary to expose parts carried by the belt to access, such reduced shearing strength promotes peeling of the central strip away from the border portions in lieu of separating the tape from the carrier by rupturing or otherwise of the adhesive bonds there-between. Such tear lines thus reduce or eliminate the described problems caused by such bonds of undue fluctuations in the pulling force exerted on the tape and of downtime caused by accidental breakage thereof. Moreover, such tear lines can be provided at low expense and without departure from the specifications set out by EIA Standard 481 and without any practical need for recycling the carrier belt and/or the part covering means on the belt.

BRIEF DESCRIPTION OF THE DRAWING

For a better understanding of the invention, reference is made to the following description of exemplary embodiments thereof and to the accompanying drawings wherein:

FIG. 2 is an enlarged plan view of a segment of the FIG. 1 conveyer tape;

FIG. 8 is a schematic plan view of a system for utilizing the FIG. 1 conveyer tape; and FIG. 9 is a schematic front elevation of the FIG. 8 system.

DETAILED DESCRIPTION

Figure 1:
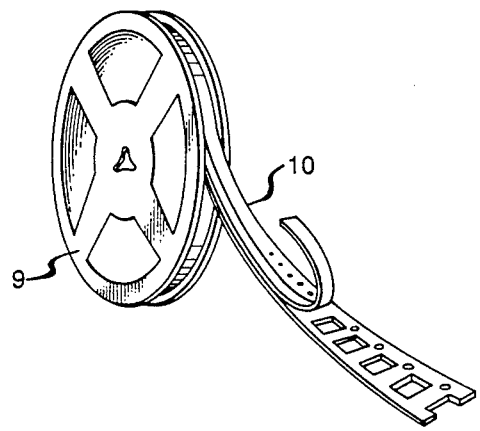
FIG. 1 is a schematic isometric view of a conveyer tape incorporating improvements according to the invention.
Figure 3:
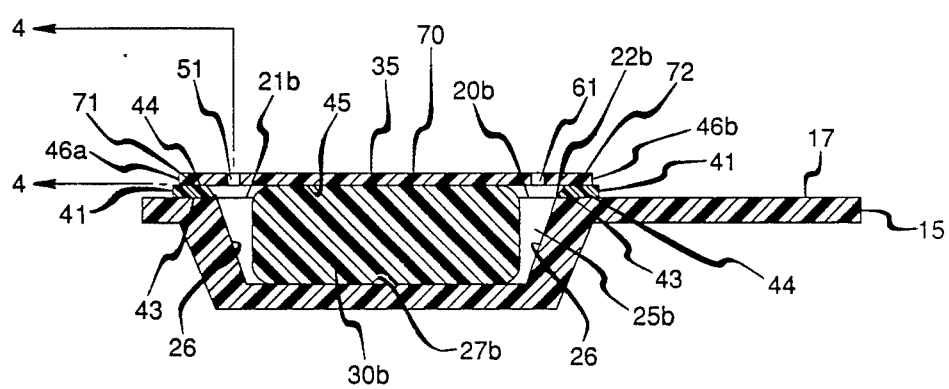
FIG. 3 is a front elevation in cross-section, taken as indicated by the arrows 3—3 in FIG. 1, of the FIG. 2 tape.

Referring now to FIG. 1, the reference numeral 9 designates a supply reel having coiled thereon a conveyer tape 10 of which a segment thereof is shown enlarged in FIGS. 2 and 3.

Considering those latter figures, the conveyer tape comprises a longitudinally elongated flexible carrier belt 15 (sometimes referred to as a carrier "tape") which in the described embodiment is made of aluminum (or other flexible metallic material) but may be made of a synthetic resinous "plastic" material or of cellulosic paper material. Belt 15 may have a lateral width of 12 mm although widths of 16 and 24 mm and larger are also common. The belt has formed therein near one of its lateral margins a set of sprocket holes 16. Alongside such sprocket holes, the belt 15 has formed therein by embossing a series of pockets 18 which constitute concavities in the belt's top surface 17, and of which the ones shown in FIG. 2 are individually designated 18a, 18b, 18c. The pockets 18 are longitudinally spaced from each other in a row 19 extending in the length of belt 15.

Pocket 18b has a rectangular upper opening 20b bounded by laterally opposite edges 21b, 22b and by longitudinally opposite edges 23b, 24b which are the outward extents of the pocket in, respectively, the lateral and longitudinal dimensions of the belt. The cavity space 25b in the pocket 18b is (FIG. 3) generally trapezoidal in lateral and longitudinal cross-section and is bounded by side walls 26 sloping downwardly and inwardly from surface 17 and edges 21b–24b to a flat rectangular bottom 27b for the pocket. Walls 26 may have a slant so steep as to approach or be vertical. All of the other pockets 18 in belt 15 are similar in size and shape to pocket 18a.

Seated respectively in pockets 18 are a set of parts 30 disposed in a row in the length of belt 15, and of which the ones shown in FIG. 2 are individually designated 30a, 30b, 30c. The parts 30 typically (but not necessarily) may be electrical components surface mountable on printed wiring boards to form circuit cards or circuit packs. Thus parts 30 may typically be, for example (and as mentioned in EIA Standard 481), any of diodes, capacitors, resistors, transistors, inductors and integrated circuits. The parts 30 may also be mechanical or electromechanical parts. All of the parts 30 carried by belt 15 may be of the same kind or they may be of different kinds arranged along belt 15 in predetermined repetitive sequences of different parts.

The parts 30 are retained in place on belt 15 by a cover-tape 35 extending in the length of belt 15 over these parts. Tape 15 is constructed of a synthetic resinous (i.e., "plastic") material and may conveniently be a polyethylene or polyamide tape. The tape 35 has a thickness of 0.061–0.069 mm which is less than the maximum thickness of 0.10 mm prescribed in EIA Standard 481.

The cover tape 35 is secured to the carrier belt 15 in a manner as follows. The row 19 of pockets 18 in belt 15 is flanked on its opposite sides by two bands (or zones) 40a, 40b of adhesive material 41 deposited intermittently or continuously in the lengths of such bands. The laterally inward edges 42a, 42b of such material in zones 40a, 40b are located either laterally outward of but adjacent to the laterally outward edges 21, 22 or pockets 18 or, alternatively, contiguous with such pocket edges. In each of these zones 40a, 40b, the lower surface 43 of the material 41 is adhesively bonded to the top surface of belt 15 while the upper surface 44 of such material is adhesively bonded to the lower surface 45 of cover tape 35 at the lateral margins 46a, 46b of such tape in the longitudinal extent thereof. The tape 15 is thus fastened at such margins throughout its length by such material 42 to the belt 15. By virtue of being so secured, the tape 15 retains the parts 30 in the pockets 18 in belt 15 so long as the tape continues to extend over those components.

While tape 35 is depicted in FIG. 2 as stretching in a flat manner over the component 30b retained thereby, in cases where such component projects above the top surface 17 of belt 15, the tape 35 contacts, and is convexly bowed over the top of, such component. As a result a convex bulge is created in the tape, with gathers being formed in the tape between consecutive areas of such bulges.

Figure 4:
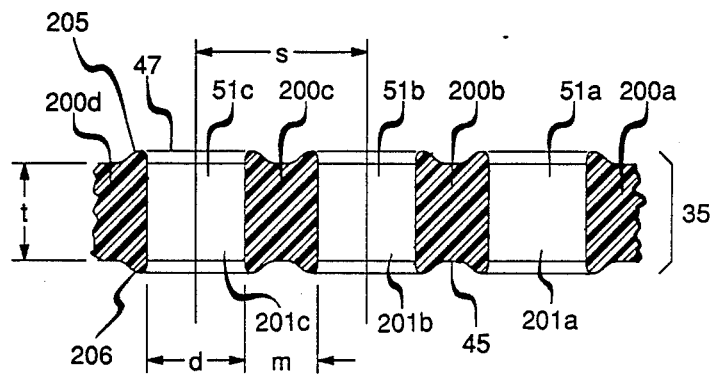
FIG. 4 is a further enlarged, right side elevational view in cross-section, taken as indicated by the arrows 4—4 of FIG. 3, of a portion of the cover tape of the FIG. 2 conveyer tape, such cross-section being taken along one of the tear lines demarcated in such cover tape.

Coming now to the improvements according to the invention hereof, the cover tape 35 has defined therein a pair of tear lines 50, 60 disposed on laterally opposite sides of the tape and extending in its length parallel to the row 19 of component parts 30. Line 50 is demarcated in the tape by longitudinally separated and uniformly spaced perforations collectively designated as perforations 51 and ones of which are individually designated as 51a, 51b, 51c (FIG. 4). Tear line 60 is similarly demarcated in the tape by longitudinally separated uniformly spaced perforations 61. The two tear lines 50, 60 divide the expanse of the cover tape into (a) central strip 70 disposed between and bounded by these two lines, and (b) two border strips or portions 71, 72 to the left and right, respectively (FIGS. 2 and 3) of strip 70. Border strips 71, 72 are adhered to the carrier belt 15 by the adhesive material 41 in, respectively, the bands 40a and 40b.

The perforations 51 which demarcate line 50 serve to form in the tape 35 a set of corresponding discontinuities between the internal structure of the tape in central strip 70 and the internal structure of the tape in border strip 71. To put it another way, because of the presence of perforations spaced in the length of tear line 50, the cross-section of the tape 35 taken in that line consists in such length of cross-sectional areas (at the locations of such perforations) where the internal structure of the tape is discontinuous between strips 70, 71 (such areas being "discontinuities") alternating with cross-sectional areas where the internal structure of the tape is continuous between strips 71, 72 (such latter areas being "continuities"). Accordingly, the internal structure of tape 35 along tear line 50 is partly continuous and partly discontinuous with respect to such structure as included in respectively, strips 70, 71.

What has just been said about tear line 50, perforations 51 and strips 70, 71 applies similarly to tear line 60, perforations 61, and strips 70, 72.

Coming to the lateral placement of the tear lines 50, 60, such lines are laterally inward both of (a) the laterally inner edges 42 of the material 41 in the adhesive zones (or bands) 40, and (b) the laterally outer edges 21, 22 of the pockets 18 in belt 15. On the other hand, the tear lines 50, 60 are laterally outward of the laterally outer ends of the parts 30 in such pockets. As shown, the tear lines in the lateral dimension are centered over the sloping lateral sidewalls 26 of the pockets 18. Because such tear lines are literally outward of such ends of parts 30, peeling of a tab 75 at the front end of central strip 70 away from border strips 71, 72 (FIG. 2) leaves behind between these border strips a gap 76 wide enough and appropriately located to permit components 30 to be lifted up out of pockets 18 and pass with clearance through the gap.

USE, FEATURES AND MANUFACTURE OF EMBODIMENT

The improvement hereof is used, in general terms, as follows. When it is desired to expose parts 30 at the front of tape 10 to access, there is applied to the front of strip 70 of tape 35 a pulling force P effective to produce an uncovering of these parts. In connection with force P, the composition of the adhesive material 41 in adhesive bands 40 and the conditions of bonding of such material to the belt 15 and tape 35 are selected to produce between those elements, at bands 40, adhesive bonds of strengths greater than the range of 0.4±0.3 newtons prescribed by EIA Standard 481 to assure that a pulling force in that range applied to tape 35 will not likely rupture such adhesive bonds. Similarly, the tape 35 itself has, in the absence of tear lines 50, 60, an unmodified shearing strength great enough to assure that the tape will not likely be accidentally sheared from side to side (and thus broken) by application thereto of a pulling force in such range.

As stated, the tear lines 50, 60 are demarcated by discontinuities formed in the structure of the tape 35 along these lines. The effect of these disconuities is to weaken the shear strength of that tape along each of such lines from the tape's unmodified shear strength to a modified strength therefor having a value within or below the peel strength range of 0.4±0.3 newtons specified by the Standard. The result is that, when an upward pulling force P is applied to the center strip 70 of tape 35, such force at a value therefor not exceeding that range will cause the front end of strip 70 to separate from border strips 71, 72 so as to convert a length of that strip into tab 75 and to expose to access the parts 30 on belt 15 previously covered by that length. The perforations 51, 61 included in tear lines 50, 60 are (as later discussed in more detail) controlled in size and mutual spacing to keep the reduced shearing strength of the tape substantially constant in value along the tear lines as the tape's center strip 70 is progressively peeled away from the rest of the tape. Hence the separation of that center strip from the underlying belt 35 proceeds in a consistent and uniform way with very low probability of breakage of the strip and with very small or no significant fluctuation in the value of pulling force needed to produce such separation. Moreover, since both the strength of the adhesive bonds between elements 15, 35 and the unmodified shearing strengths of tape 35 are designed to be substantially in excess of such value of the pulling force, there is a very low probability that the application of such force to tape 15 will result in rupture of such bonds or breakage of the tape as a whole.

Further details regarding the matters discussed above will be later set out.

Figure 6:
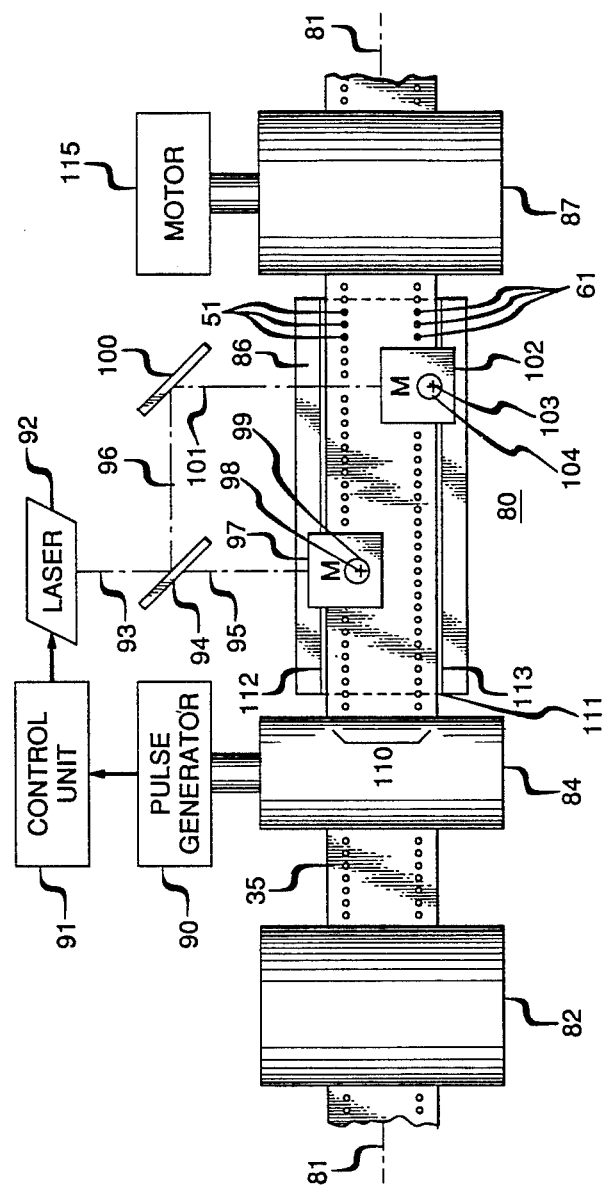
FIG. 6 is a schematic plan view of a system for producing the tear lines in the cover tape of the FIG. 1 conveyer tape.
Figure 7:
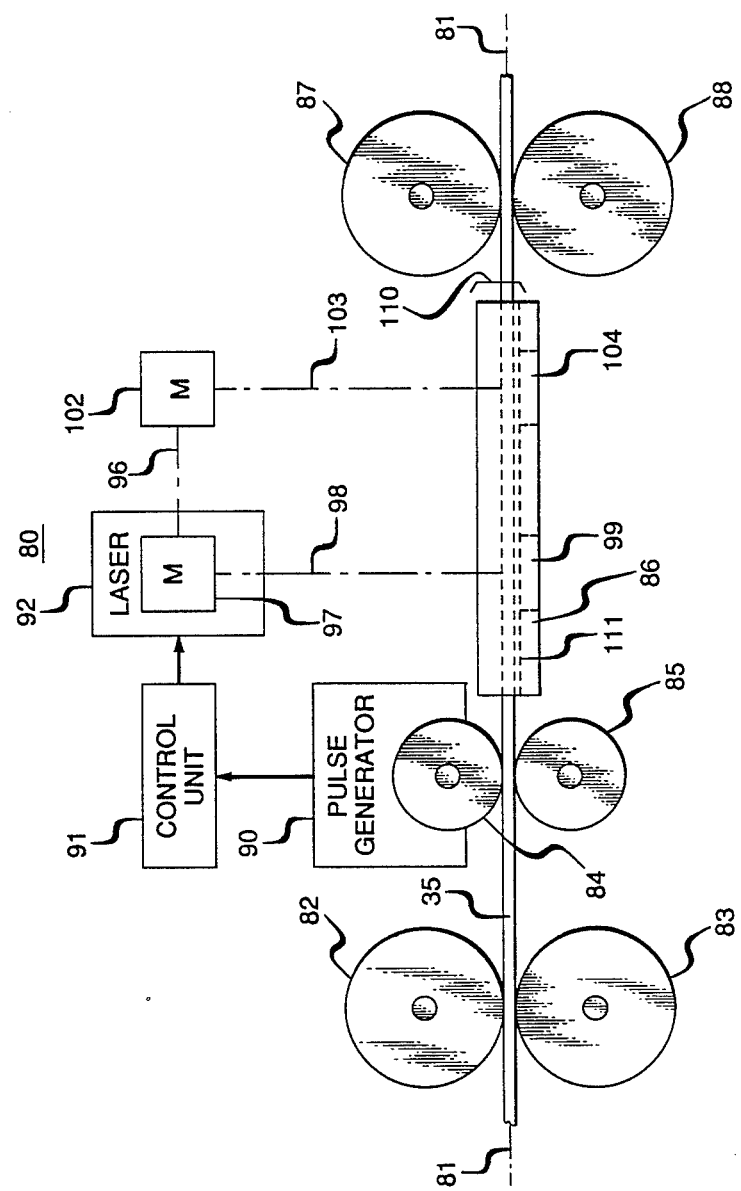
FIG. 7 is a schematic front elevation of the FIG. 6 system.

FIGS. 6 and 7 show a system 80 for producing the perforations 51, 61 in cover tape 35. The system comprises a tape path 81 along which are spaced a pair of feed-in rolls 82, 83, a pair of sensing rolls 84, 85, a guide 86 and a pair of exit rolls 87, 88. A length of cover tape 35 is passed through the nips between the paired rolls 82, 83 and the paired rolls 84, 85, is next led through guide 86, and is then passed through the nip between the exit rolls 87, 88. Tape 35 when threaded through each such nip is caused to be in pressure contact with the rolls on either side thereof by well known techniques as, for example, by constituting the rolls or rubberized material.

The sensing roll 84 is shaft coupled to a pulse generator 90 responsive to such roll's rotation to generate electrical pulses fed to control unit 91 for a laser 92 to cause that laser to emit coherent light pulses corresponding one-for-one with those electrical pulses. The light pulses from the laser emerge from it in a beam path 93 split by a beam splitter 94 into two horizontal beam paths 95, 96. Light in path 95 is directed by a mirror 97 into a vertical beam path 98 passing through a hole 99 in guide 86. Light in path 96 is first bent 90° in the horizontal plane by a mirror 100 into a horizontal beam path 101. The light in the latter path is then directed by a mirror 102 into a vertical beam path 103 passing through a hole 104 in guide 86. The described light beam paths include suitable lenses and other optics (not shown) for directing and focusing of the light in such paths.

The guide 86 is a unit having formed on its top side a tape guide channel 110 disposed in the length of and coaxial with tape path 81. Channel 110 in its cross-section transverse to such path is in the shape of a rectangular "U" so as to have a planar upward-facing horizontal bottom 111 and two planar vertical walls 112, 113 parallel to the axis of tape path 81 and on opposite sides of and upstanding from the guide bottom 111. The walls 112, 113 are spaced from each other by a distance permitting tape 35 to pass with essentially no play through the guide channel. The axis of the vertical beam paths 98 and 103 are spaced laterally inwards of, respectively, walls 112 and 113 by distances such that when tape 35 is passed through such channel, these paths will intersect with the intended locations on the tape of the tear lines 50, 60.

Exit roll 87 is coupled to a motor 115 for driving that roll. One or both of the feed-in rolls 82, 83 operably has a fictional drag applied thereto by conventional means (not shown).

System 80 operates as follows when a length of tape 35 is positioned in tape path 81 as shown in FIGS. 6 and 7. Motor 115 is energized to rotate roll 87 to move tape 35 from left to right. As the tape is so moved, it is stretched under moderate tension in guide 86 because of the frictional drag on one or both of rolls 82, 83. Moreover, as the tape so moves, its movement drives without slippage the sensing roll 84 in rotation such that its angular speed has a known predetermined proportional relation to the linear speed of the tape. In response to the rotation of roll 84, pulse generator 90 and laser 92 produce, respectively, electrical pulses and coherent light pulses at a repetition rate having a known predetermined proportional relation to the angular speed of rotation of roll 84 and, thus, to the linear speed of movement in path 81 of tape 35. A fraction of the energy of those light pulses follows beam paths 95, 98 and vaporizes the material of tape 35 to produce perforations 51 of uniform size and uniformly spaced from each other. Another fraction of that energy follows beam pulses 96, 101, and 103 to vaporize such material so as to produce perforations 61 of uniform size and uniformly spaced from each other. By suitably adjusting the constants of proportionality between the linear and angular speeds of respective elements 35, 84 and/or between such angular speed and the repetition rate of the pulses from unit 90, the spacing between hole centers of perforations 51, 61 can be adjusted as desired. Similarly by adjusting the optics in the various beam paths utilized in system 80, the size of the perforations 51, 61 can be adjusted as desired.

The system 80 as so far described can be used to form the perforations 51, 61 in cover tape 35 prior to the time such tape is incorporated along with belt 15 into conveyer tape 10. To so prefabricate the perforations in the cover tape is preferred because it better assures that such perforations will be uniformly spaced and dimensioned. However, the system can be readily modified to produce the perforations in tape 35 after the latter has been incorporated into the assemblage constituting conveyer tape 10. That is, system 80 may be modified so that it is the conveyer tape 10 rather than cover tape 35 which is modified along tape path 81 in the system.

A suitable laser 92 for system 80 is a Model No. V-150 $CO_2$ laser manufactured by the Lumonics Corporation. To the end of drilling the two rows of perforations in the cover tape, such laser may be operated to produce light pulses at a rate of 1200 pps with an average power over the duty cycle of the laser of 8 watts.

FIGS. 8 and 9 show a facility in which a conveyer tape 10 transports parts 30 to a work station represented in FIG. 8 by the dash line rectangle 120. Located at the station are two work tables 121, 122 underneath paths 123, 124 for, respectively, tape 10 and a conveyer belt 125 for printed wiring boards 126.

Spaced along path 123 from left to right is a sprocket wheel 130 with teeth 129, a pair of peel off rolls 131, 132, the work table 121 and a sprocket wheel 133 with teeth 134. Wheels 130, 133 are coupled by motion links 135, 136 to a geared-down motor 137 the operation of which is governed by a controller 138. Below wheel 133 is a waste bin 135.

Motor 137 is also coupled through motion link 145, gearing 146, and motion link 147 to the lower roll 131 (of the pair of peel off rolls) to rotate such lower roll through the gearing. The gear 146 is selected to produce for the rotating roll 131 a tangential speed slightly greater than that of wheels 130, 133 when driven by the motor. Because of its greater tangential speed, roll 131 will, through friction, exert a pulling on a portion of central strip 70 of tape positioned in the nip between rolls 131, 132.

The upper roll 132 of the two peel off rolls is an idler roll supported to be movable towards and away from roll 131 and to be biased under yieldable force toward the lower roll. Such support and bias can be provided by conventional means (not shown) as, for example, by having the ends of the shaft 148 for roll 132 received in journals in arms which are pivotally mounted to be angularly movable together towards and away from roll 131, and which arms are bised towards such roll 131 by respective tension springs.

Disposed to the rear of (and in laterally offset relation from) the peel-off rolls 131, 132 is a guide bar 155 and a waste bin 156 below that bar.

Turning now to the elements in path 124, the conveyer belt 125 which carries the PWBs 126 passes not only over table 122 but also a drive roll 160 located downstream of the table and adapted when operating to pull belt 125 over the table top. Roll 160 is driven in rotation by a geared-down motor 161 controlled by controller 138.

Another unit governed by controller 138 is a pick and place device 164 which is located at work station 120, and which may be a Panasonic Model MK1-LL pick and place machine. Device 164 comprises a vacuum pick up arm 165 and a head 166 to which such arm is coupled. Head 166 is controlled by controller 138 to direct arm 165 to perform sequences of horizontal and vertical movements dictated by the controller.

The facility of FIGS. 8 and 9 operates as follows. As preliminaries, a length of conveyer tape 10 including its front end is positioned in path 123 so that the teeth of sprocket wheel 130, 134 are received in appropriate sprocket holes 16 of the tape. A front end section of the central strip 70 of cover tape 35 is separated from carrier tape 15 to form a free tab 75. Tab 75 is threaded through the nip between rolls 131, 132, passed over bar 155 and then allowed to hang down towards bin 156. The carrier belt 125 with the PWBs 126 thereon is assumed to already be in place as shown.

Operation is initiated by controller 138 which energizes motors 137, 161 to produce step movements of tape 10 and belt 125 with a dwell occurring between each step motion of each of these elements. One or more dwell periods of tape 10 may occur within any one dwell period of belt 125. In each of the dwell periods of belt 125 and tape 10, one of the PWBs 126 on the belt and one of the parts 30 on the tape is positioned over the center of, respectively, the work table 121 and the work table 122. In each such dwell period for a part 30 centered over work table 121, controller 138 causes head 166 of pick and place device 165 to control arm 165 to pick up such part by vacuum, transport the part in a path 180 to a position at which the part is over the PWB which is then dwelling on work table 126 (and which is designated 126b in FIG. 8), deposit the part at a predetermined location on the PWB, and then return via path 180 to its initial position to be ready to pick up a new part. After one or more parts have been deposited on such PWB, they are surface mounted thereon by further processing steps. When each of the parts 30 on tape 10 to be deposited on a particular PWB have been placed thereon in the manner described above, carrier belt 125 moves one step to advance a new PWB 126 to a referenced position on table 122 and the cycle is repeated for that new PWB. As parts 30 are supplied over a number of cycles of operation to work station 120 by the movement of tape 10, the portion of cover tape 35 separated from carrier belt 15 is received in bin 156, and the portion of such carrier belt from which parts 30 have been removed is received in bin 135.

Figure 5:
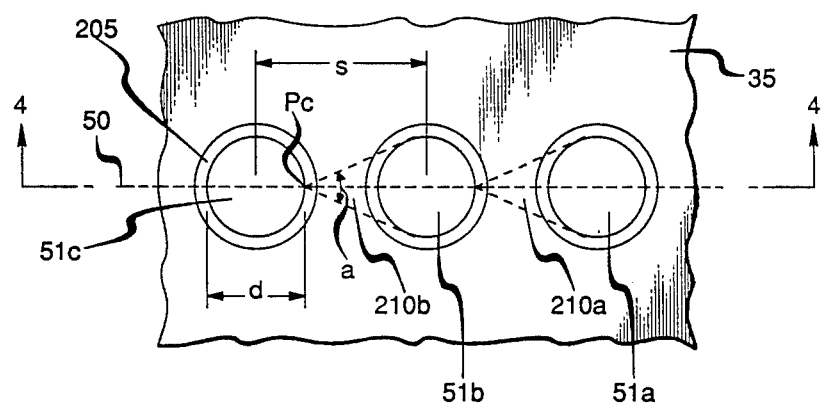
FIG. 5 is a plan view of the cover tape portion depicted in FIG. 4.

Further consideration will now be given to the parameters of the size and spacing of the perforations 51, 61 in the tear lines 50, 60 in cover tape 35. Reference is made in such connection to FIGS. 4 and 5 and to the following Tables I and II which set out details of experiments conducted to determine the effects of varying such parameters in the manner indicated in the tables.

TABLE 1

STATISTICAL SUMMARY OF HOLE PERFORATION DATA
(all dimensions in mm)

| SAMPLE | HOLE DIA. d | HOLE SPACING, s | PEEL RESULTS |
|---|---|---|---|
| I-B | 0.102 | 0.254 | w/dif |
| II-A | 0.096 | 0.254 | neg. |
| II-C | 0.117 | 0.152 | v. good |
| II-D | 0.079 | 0.302 | neg. |
| III-B | 0.112 | 0.152 | v. good |
| III-C | 0.103 | 0.152 | v. good |
| IV-A | 0.085 | 0.254 | neg. |
| IV-B | 0.097 | 0.152 | v. good |
| A-1 | 0.068 | 0.190 | poor |
| B-1 | 0.062 | 0.160 | fair |

TABLE 1-continued

STATISTICAL SUMMARY OF
HOLE PERFORATION DATA
(all dimensions in mm)

| SAMPLE | HOLE DIA. d | HOLE SPACING, s | PEEL RESULTS |
|---|---|---|---|
| C-1 | 0.076 | 0.183 | poor |

TABLE II

| HOLE CHARACTERISTICS RATIOS | | | |
|---|---|---|---|
| SAMPLE | d/t | d/s | PEEL RESULTS |
| I-B | 1.48 | 0.40 | w/dif. |
| II-A | 1.39 | 0.38 | neg. |
| II-C | 1.70 | 0.77 | v. good |
| II-D | 1.14 | 0.26 | neg. |
| III-B | 1.62 | 0.74 | v. good |
| III-C | 1.49 | 0.68 | v. good |
| IV-A | 1.31 | 0.33 | neg. |
| IV-B | 1.49 | 0.64 | v. good |
| A-1 | 0.99 | 0.36 | poor |
| B-1 | 1.02 | 0.39 | fair |
| C-1 | 1.10 | 0.42 | poor |

FIG. 4 is a view of a vertical cross-section along tear line 50 of the internal structure of cover tape 35. As shown, that cross-section consists of solid regions or webs 200a–200d of the tape material alternating with void regions 201a–201 provided by the perforation holes 51a–51c in the tape. The regions 200 and the regions 201 constitute continuities and discontinuities respectively between the tape material in, respectively, central strip 70 and border strip 71. The holes 51 are circular cylindrical in horizontal cross-section such that the distance occupied by each void region in the length of line 50 is equal to the diameter d of the hole, the value of d being assumed (as is reasonable for the purposes hereof) to be the same for all holes 51 in line 50. The perforations defining the tear line may, however, have other shapes in horizontal cross-section such as elliptical, square or rectangular. Accordingly, the term "diameter" as used for the hole means (unless the context otherwise requires) the size of the hole in the vertical cross-section along the tear line.

In the FIG. 4 cross-section, the distance between adjacent hole centers is designated s, and the size of the webs 200 in the direction of line 50 is designated m. Evidently, m=s−d. The thickness of tape 35 is designated t, and such thickness is about 0.07 mm.

When the holes 51 are drilled by a $CO_2$ laser, the infra-red energy thereof normally produces beads 205, 206 of resolidified melted tape material surrounding the top and bottom openings of such holes. When, however, such holes are drilled by an Eximer laser operating in the ultraviolet, beads of such sort are not produced to any significant extent.

The perforations 51 promote the uniform peeling away, by the pulling force P, of the tape's central strip 70 from the tape's border strip 71 (FIG. 2) in the following ways.

First, as earlier stated, holes 51 reduce from its initial value $S_0$ to a value $S_1$ the shearing strength of tape 35 along tear line 50. This is so because the creation by the holes of the void regions 201 substracts from the material for holding tape strips 70, 71 together in the presence of shearing forces thereon. The values of the ratios d/s and m/d are measures of, respectively, the relative reduction $(S_0-S_1)/S_0$ in shearing strength and the ratio $S_1/S_0$ of the two shearing strengths, and the latter ratios vary in value directly with the former ratios. The values of the latter ratios are, however, not directly proportional to the former ratios. An explanation therefor is that the holes 51, where they occur along line 50, do not remove holding strength in shear in the vertical cross-section of the tape structure in proportion to the relative movement of such cross section occupied along such line by the void regions 201 (i.e., in proportion to the ratio m/d). That is so because, although no holding strength is provided in the void regions of any particular hole, it is evident that some of such strength is still provided by the tape material which surrounds such hole and which forms a "bridge" between the web regions 200 adjacent to and on either side of such hole. For example, the tape material surrounding hole 51b creates between the web regions 200b, 200c adjacent to an on opposite sides of hole 51b a "bridge" which contributes to the holding strength of these web regions and provides a bridge for force communication between them. The holes 51 do, however, create along line 50 respective "deficiencies" in the sharing strength of tape 35, so as, by those deficiencies, to reduce its strength along such line from $S_0$ to $S_1$.

Second, each of the holes 51 along line 50 subtends an angle a having a vertex at a point p which is the nearest point to such hole on the edge of the next adjacent hole lying, say, to the left. FIG. 5 shows such angles subtended by the holes and having sides enclosing fan shaped areas 210. A significant aspect of such a fan shaped area is that a tear in tape 35 initiated at the point p of the area and remaining within it during the tear's propagation through the tape material will inevitably terminate at the hole at the wide end of the area so that such tear conforms to tear line 50. Another significant aspect of fan shaped areas 210 is that their presence established in the tape structure a preferential direction for propagation through such structure of a tear initiating at the edge of one of such holes, such direction being toward the next rightward hole (or next leftward one if the propagation is leftward). The greater the angle a of such areas, the greater a statistical preference there is for such an initial tear at the edge of one hole to propagate to the next adjacent hole instead of wandering randomly off in another direction through the tape structure to produce an accidental break in the tape.

It follows that, by making the angles a of such areas 210 sufficiently large, there can be attained (in circumstances otherwise appropriate) an almost 100% probability that the application of pulling force P to control strip 70 of table 35 will produce tears therein which will propagate solely along tear lines 50 and 60 instead of propagating randomly through the tape material. With regard to the foregoing, selecting values of d and s for the holes to increase the ratio d/s will have the effects both of reducing more the tape's shearing strength along line 50 and of increasing the angle a of the fan areas 210. Thus, perforation sizes and spacings providing relatively higher values for d/s would appear to provide a two fold advantage. That such is so confirmed by the data set out by Table II which shows that very good peeling results are obtained in the case of samples II-C, III-B, III-C, and IV-B wherein the value of d/s is high as compared to the poorer results obtained with the other samples with lower d/s. Such data thus indicates that, to obtain the best peeling results (by which is meant consistent peeling of cental tape strip 70 away from border tape strips 71, 72 along tear lines 50, 60) the lower limit for the value of the ratio d/s should preferably be about 0.5. To put it another way, preferably the diameter of the holes is to be greater than the distance separating the near edges of adjacent holes such that the ratio m/d is less than 1.0.

With regard to upper limit, the ratio d/s necessarily must have a value of less than 1.0 since at such value the widths in line 50 of the web regions 200 would reduce to zero such that strip 70 would be severed altogether from strip 71. Also values of d/s below but very close to 1.0 would make very fragile the bond between such two strips. The data of Table II makes clear, however, that an acceptable upper limit for d/s is a value of about 0.8. Hence, it is concluded that the value of the ratio d/s is preferably in the range between the value of about 0.5 and the value of about 0.8.

Because the ratio d/s is a dimensionless quantity, the eliciting of a preferred range for such ratio is not alone determinative of the actual sizes and spacings which are preferable for the perforations 51. A range for such preferred actual sizes and spacings can be determined, however, by eliciting a preferred range of values for the additional ratio d/t.

Referring to Table II, a comparison of the data on samples II-A and IV-B indicates that, for a value of the ratio d/t of about 1.0, the ratio is not a significant parameter in controlling peeling results since, in the case of sample II-A, such results are negative whereas, in the case of sample IV-B, the results are the very opposite. There are other considerations, however. There is reason to believe that, as the diameter d of the hole 51 decreases in relation to the thickness t of the tape 35 to be much smaller than that thickness, both the capability of such holes to produce the mentioned "deficiencies" in tape holding strength against shear and the capability of such holes to direct propagation of a tear from one hole to the next progressively diminishes relative to the value of the hole diameters to the point of being insignificant when d is very much smaller than t. Thus, while holes 51 can be smaller in diameter than the thickness of tape 35, such holes should, we have concluded, preferably be greater in diameter than one-half the thickness of the tape. In other words, it is concluded that the lower limit for the preferred range of d is about 0.5 t.

The upper limit of the preferred range for d is a function of the geometry of the conveyer tape 10. Specifically, the perforations 51 should be positioned in the width of cover tape 35 so that the outer edges of these perforations are laterally inward of the inner edge 42a of the adhesive band 40a (FIG. 2). A consequence, however, of fulfilling such criterion is that, as the diameter d of the holes 51 increases, the tear line 50 (which coincides with the centers of such holes) is shifted laterally inward to be displaced by a progressively greater distance from such edge 42a.

Too much of such inward shifting of line 50 is, however, undesirable because it constitutes inefficient usage of the lateral space of tape 35. Moreover, if the diameter of the holes is made too great, line 50 will be displaced so far in from edge 42a that the line will be laterally inward of the left ends (FIG. 2) of the parts 30 on belt 15 to cause the removal of those parts to be impeded. Hence, it has been concluded that the range of preferred values for the diameter d of the perforations 51, 61 has an upper limit of about 2 t. Such value is approached in the case of samples II-C and III-B shown in Table II in which the d/t values are, respectively, 1.70 and 1.62 and in which very good peeling results were obtained.

Another factor which may set an upper limit to the range of values for d/t is the radial width of the annular beads on the surfaces 45, 47 of tape 35 in cases where such beads are formed. That is, the ratio d/t should preferably have a value no greater than that causing merger into each other of the beads surrounding adjacent perforations.

The above described embodiments being exemplary only, it is to be understood that additions thereto, omissions therefrom and modifications thereof can be made without departing from the spirit of the invention. For example, the invention is applicable to all the conveyer tapes described in EIA Standard 481 including tapes of the kind wherein the part-retaining cavities in the carrier belt are provided not by embossed pockets as shown in FIG. 2 but, instead, by punching holes entirely through the carrier belt and by then adhering to such belt a bottom cover tape which provides closures for the bottoms of such holes.

Accordingly, the invention is not to be considered as limited save as is consonant with the recitals of the following claims.

We claim:

1. The improvement in a component part conveyer comprising: a longitudinally elongated carrier belt, a stock of component parts carried on said belt in a row of such parts extending lengthwise on such belt, an adhesive deposited on said belt in bands flanking such row, and a tape extending in the length of said row over said parts to hold them on said belt, and having regions on laterally opposite sides of said row which are bonded to said adhesive to attach said tape to said belt, said improvement comprising: a pair of tear lines defined in said tape alongside and on opposite sides of the centerline of said row and bounding opposite sides of a strip of said tape extending in its length between said lines, said tear lines being demarcated by discontinuities formed in said tape's structure to weaken its shear strength along such lines, and said lines promoting peeling at the front of said belt of said strip away from border portions of said tape which are on either side of said strip and remain adhered to said belt, said peeling providing access to ones of such parts on said belt.

2. The improvement according to claim 1 in which said tear lines are disposed laterally outwards of the ends in the lateral dimension of said parts to permit passage thereof away from said belt with clearance through the gap left between said border portions of said tape by the peeling therefrom of said strip.

3. The improvement according to claim 1 in which said tear lines are disposed laterally inward of such adhesive-containing bands on said belt and said strip is unadhered to said belt to facilitate pulling of such strip off of such belt.

4. The improvement according to claim 1 in which such adhesive-containing bands on said belt are disposed laterally outward of the ends in the lateral dimension of said parts in said row and in which said tear lines are disposed laterally between such bands and in such ends and said strip is unadhered to such belt.

5. The improvement according to claim 1 in which said discontinuities in said tape's structure comprise for each such tear line a series of perforations made in such tape and spaced apart along such line.

6. The improvement according to claim 5 in which said perforations are made by removal of material from said tape by the action of a laser beam.

7. The improvement according to claim 5 in which said perforations are made in said tape prior to attachment thereof to said belt.

8. The improvement according to claim 5 in which said perforations are made in said tape after attachment thereof to said belt.

9. The improvement according to claim 1 in which said belt has therein a set of sprocket holes spaced apart in a line parallel to and offset in one lateral direction from the centerline of said belt, and in which said row of parts and said tape over said parts have centerlines offset in the other lateral direction from said belt's centerline.

10. The improvement according to claim 1 in which the top surface of said belt is therein a series of cavities spaced apart in the length of said row and in which said component parts are seated, and in which said tear lines are disposed laterally inwards of the laterally outer edges of said cavities.

11. The improvement in a component part conveyer comprising: a longitudinally elongated carrier belt, a stock of component parts carried on said belt in a row of such parts extending lengthwise on such belt, an adhesive deposited on said belt in two bands flanking said row and displaced laterally outward therefrom, and a tape extending in the length of said row over said parts to hold them on said belt, and having regions on laterally opposite sides of said row which are bonded to said adhesive to attach said tape to said belt, said improvement comprising, two sets of perforations formed in said tape on opposite sides of the centerline of said row, the perforations of each such set being spaced apart in the length of said tape to demarcate a tear line extending alongside of said row and providing along such line a zone of weakened shearing strength in the structure of said tape, the two tear lines thus demarcated being disposed in the lateral dimension to be inward of said adhesive containing bands while being displaced laterally outwards from said row, and said two tear lines bounding opposite sides of a strip of said tape extending in its length between said lines, said strip being adapted to be peeled at the front of said belt away from border portions of said tape which are on either side of said strip and remain adhered to said belt so as, by such peeling, to provide access to ones of such parts on said belt.

12. The improvement according to claim 11 in which the perforations in each tear line are substantially uniformly spaced along such line, and are of substantially uniform diameter, and in which the ratio d/s of the diameter d of such perforations to the spacing s between the centers of perforations next to each other is a ratio having a value in excess of a lower limit therefor of about 0.5.

13. The improvement according to claim 12 in which said ratio has a value in the range between the lower and upper limits of, respectively, about 0.5 and about 0.8.

14. The improvement according to claim 11 in which the perforations in each tear line are substantially uniformly spaced along such line and are of substantially uniform diameter, and in which the value of the ratio d/t of the diameter d of such perforations to the thickness of t of said cover tape is in the range between the lower and upper limits of, respectively, about 0.5 and about 2.0.

15. The improvement according to claim 11 in which said perforations are laser drilled perforations.

* * * * *